United States Patent [19]

Pass

[11] Patent Number: 4,752,745

[45] Date of Patent: Jun. 21, 1988

[54] OPTO-ISOLATED BIAS CIRCUIT FOR OPERATING PUSH-PULL AMPLIFIERS IN CLASS A AND CLASS AB MODES

[75] Inventor: Nelson S. Pass, Auburn, Calif.

[73] Assignee: Threshold Corporation, Auburn, Calif.

[21] Appl. No.: 86,932

[22] Filed: Aug. 18, 1987

[51] Int. Cl.[4] ............................................. H03F 3/26
[52] U.S. Cl. ..................................... 330/265; 330/59; 330/267
[58] Field of Search ................. 330/59, 263, 264, 265, 330/267, 308

[56] References Cited

U.S. PATENT DOCUMENTS

| | | | |
|---|---|---|---|
| 3,995,228 | 11/1976 | Pass | 330/13 |
| 4,121,168 | 10/1978 | Stitt | 330/59 X |
| 4,638,260 | 1/1987 | Hamley | 350/254 |

Primary Examiner—Eugene R. LaRoche
Assistant Examiner—Steven J. Mattola
Attorney, Agent, or Firm—Thomas Schneck

[57] ABSTRACT

A high fidelity audio amplifier of the push-pull complementary symmetry type, featuring a feedback circuit with a bias sensing element connected to the output terminals of the output transistors. The feedback circuit includes a photoemitting element in optical communication with a photoconductive element which determines the relative voltage difference of the input terminals of the complementary symmetry output transistors.

4 Claims, 2 Drawing Sheets

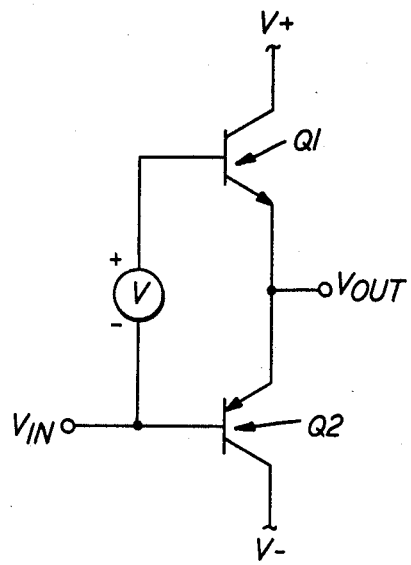
FIG._1.
(PRIOR ART)
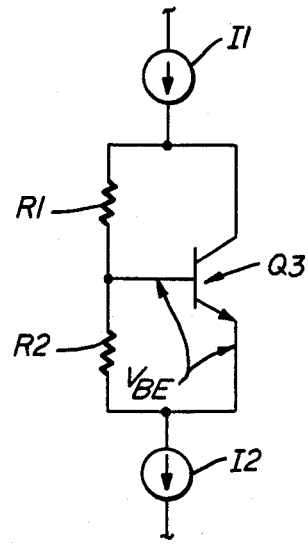
FIG._2.
(PRIOR ART)
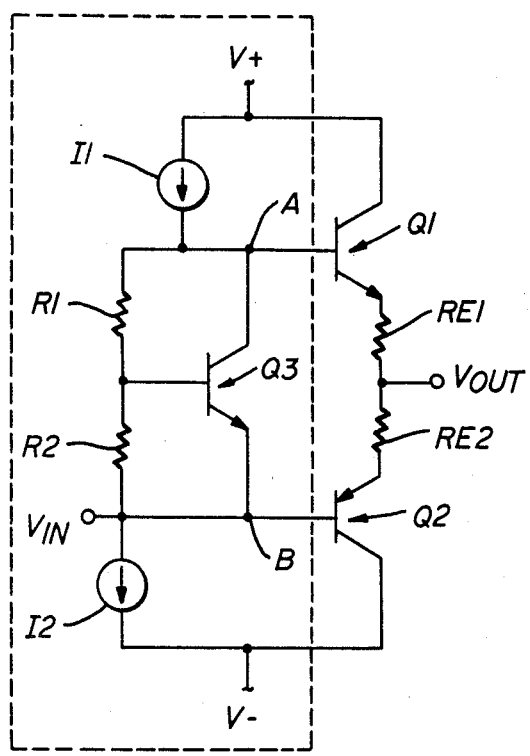
FIG._3.
(PRIOR ART)
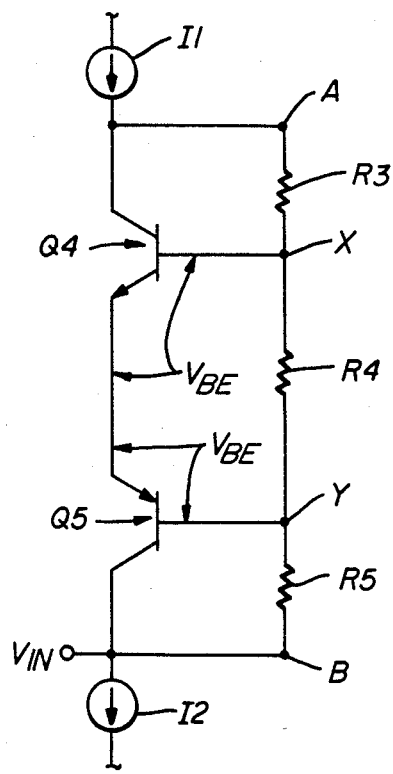
FIG._4.
(PRIOR ART)

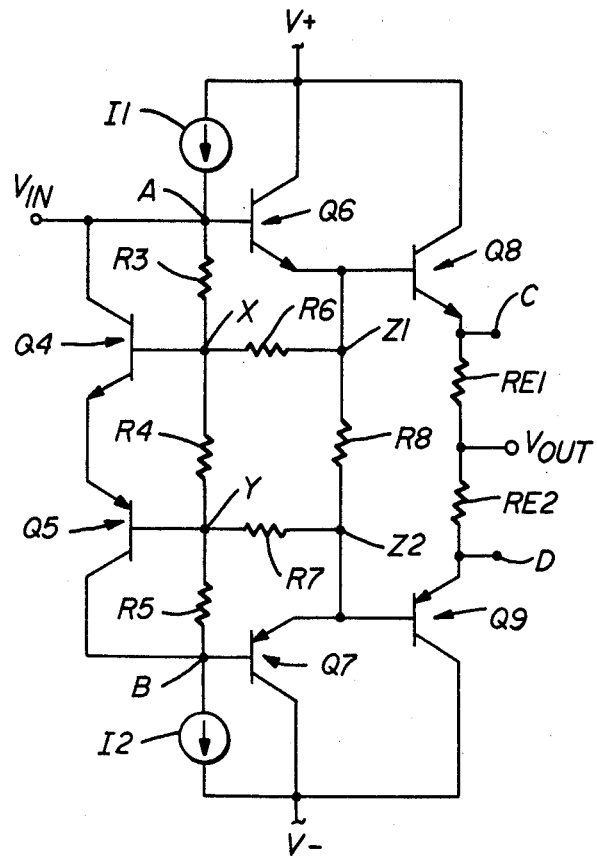
FIG._5.
(PRIOR ART)
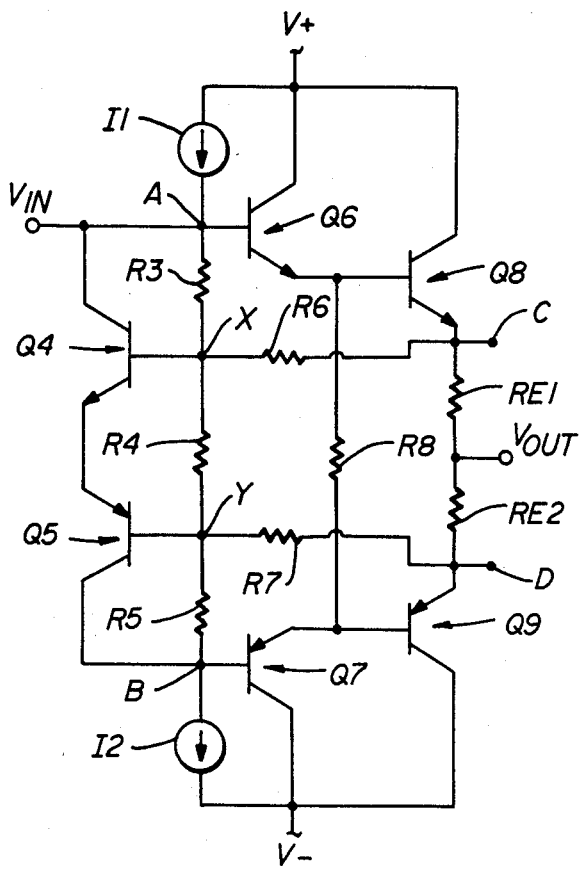
FIG._6.
(PRIOR ART)
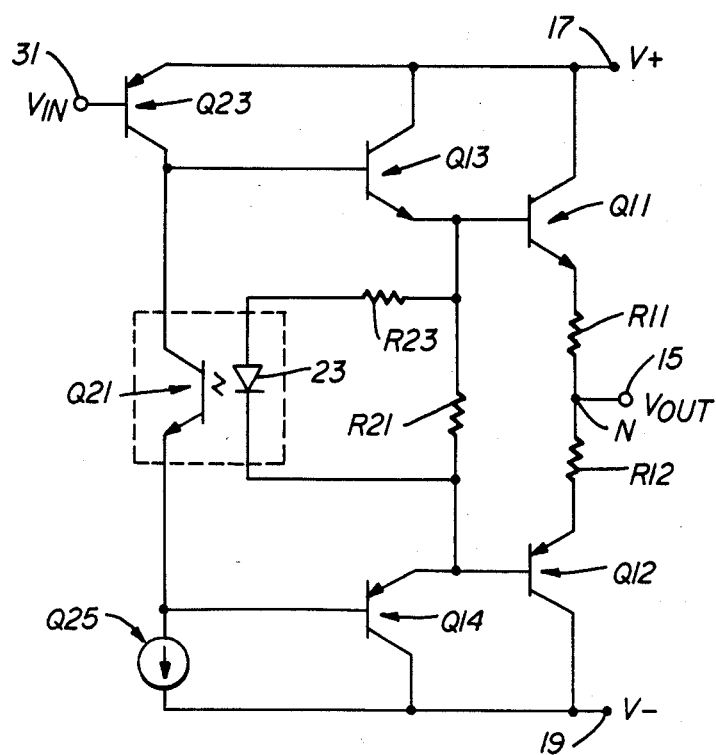
FIG._7.

OPTO-ISOLATED BIAS CIRCUIT FOR OPERATING PUSH-PULL AMPLIFIERS IN CLASS A AND CLASS AB MODES

DESCRIPTION

1. Technical Field

The invention relates to high fidelity audio amplifiers and more particularly to an active bias circuit for achieving Class A and Class AB operation in push-pull transistor amplifiers.

2. Background Art

Low distortion is a primary performance feature desired in high fidelity power amplifiers. Most such amplifiers use a push-pull complementary output stage which exhibits a nonlinearity at the operating point where the load current is transferred from one complementary half of the amplifier to the other. This nonlinearity is referred to as "crossover" or "notch" distortion and is minimized or eliminated by operating the output stage with an idle current, or bias, which defines an operating region where both positive and negative halves of the output stage share current. The bias current smooths out the transfer curve of the output stage of the amplifier and reduces distortion. This bias current is controlled by a circuit known as a bias circuit which provides a controlled voltage potential across the inputs of the complementary output devices, shown in FIG. 1.

The bias current is set at a point representing the best trade off between linearity and efficiency. High bias currents, as found in Class A operation, give lower distortion performance at the expense of high idle dissipation, while low bias currents, as in Class AB operation, give higher efficiency but have greater distortion.

Generally it is desired to set the bias current at a fixed level, and so the bias circuit is designed to provide a DC potential across the inputs of the complementary output devices, often with some manner of temperature compensation to insure that the bias current through the output stage remains constant over a range of operating temperatures. This is necessary, for example, in a bipolar transistor output stage because the base-emitter junction voltages for a given current will decrease with increased temperature, with the transistors having a positive temperature coefficient.

In many examples of amplifiers using complementary symmetry output stages the bias current is developed by use of a voltage generator whose voltage output is equal to the sum of the forward bias voltage drops of the emitter followers plus the IR drops of the resistors in the bias path. FIG. 2 shows a bias voltage generator of the prior art and FIG. 3 shows a use of this bias circuit in a complementary symmetry output stage.

The apparatus of FIG. 2 generates a relative constant bias voltage $V_b$ across bias feed nodes A and B:

$$V_b = V_{BE} \times (R1+R2)/R2$$

This equation is derived by noting the voltage across R2 is equal to $V_{BE}$. The current flowing through R1 is assumed to be the same current flowing through R2, neglecting the small base current of the transistor so that the current through R2 is equal to $V_{BE}/R2$.

Referring to FIG. 3, the bias transistor Q3 of a $V_{BE}$ Multiplier is often mounted in thermal contact with the output transistors for temperature compensation, as the $V_{BE}$ of the bias transistor will have a similar dependence on temperature as the junction drops of the output transistors.

In U.S. Pat. No. 3,995,228 to N. Pass, a bias circuit is described and is shown in simplified form in FIG. 4. In FIG. 4, a pair of $V_{BE}$ Multipliers has been provided. A first multiplier comprises the bias transistor Q4 and the multiplier resistor R3 while the second multiplier comprises the bias transistor Q5 and the multiplier resistor R5.

The first $V_{BE}$ Multiplier shares a voltage divider resistor R4 with the second $V_{BE}$ Multiplier. The total output across the $V_{BE}$ Multiplier is taken across the output nodes A and B. This bias voltage, $V_b$, is approximately equal to $$2V_{BE} \times (R3+R4+R5)/R4.$$

Since R4 appears in the denominator of the equation, it is termed the voltage divider resistor. R4 is shared by each of the two $V_{BE}$ Multipliers which generate $V_b$ across the bias feed nodes A and B in the newly provided circuit.

An advantage of the circuit lies in its symmetry. Because of the shared resistor R4 between the internal voltage reference nodes X and Y, the circuit provides symmetric working access to the bases of the bias transistors Q4 and Q5 and seen in FIG. 5. This working access can be used to provide dynamically controlled bias as in U.S. Pat. No. 3,995,228 to N. Pass, and also can be used to provide negative feedback to provide additional stability to the bias.

In the prior art circuit of FIG. 5, the bias transistors, Q4 and Q5 which with their respective multiplier resistors R3 and R5 and the shared divider resistor R4 form the bias circuit for output transistors Q4, Q5 and their respective drivers Q6 and Q7 from the bias feed nodes A and B. The internal voltage reference nodes X and Y are referenced to the output nodes Z1 and Z2 of the emitter follower output circuit through resistors R6 and R7.

The voltages across nodes X and Z1, Y and Z2, have a voltage slightly greater than the base to emitter drop, $V_{BE}$ of the transistors Q3 and Q4. The total bias voltage, $V_b$ across bias feed nodes A and B, is equal to the base to emitter drop $V_{BE}$ across each output transistor, including its driver plus the voltage drop across each resistor in the emitter circuit of each output transistor, $V_{RE1}$ and $V_{RE2}$.

The circuit of FIG. 5 uses the connections of R4 from X to Z1 and of R5 from Y to Z2 to provide negative feedback to the bias circuit. As the $V_{BE}$ voltages of Q6 and Q7 decrease with increased operating temperature, the current through R6 and R7 increase. The increase in current through R6 and R7 causes a decrease in current across R3 and R4, resulting in a corresponding decrease in voltage across bias nodes A and B. This circuit is designed to operate Q6 and Q7 in Class A operation, and can be adjusted to operate output transistors Q8 and Q9 in either Class A or Class AB mode.

An alternative to FIG. 5 is presented in FIG. 6, where the feedback connections have been made from X to C and from Y to D through the resistors R6 and R7, but otherwise the circuit is identical to the one shown in FIG. 5. This method is useful in providing more effective feedback than the circuit of FIG. 5 if the output transistors Q8 and Q9 are to be operated in Class A mode with high potential drops across $R_{E1}$ and $R_{E2}$. The bias circuits of FIG. 5 and FIG. 6 have an advantage in that the feedback connection provided through R6 and R7 gives greater stability to the bias.

These bias circuits have a disadvantage, however, in that the feedback connections of R6 and R7 can create a problem which arises under conditions where the combined $V_{BE}$ and resistive voltage drops of one half of the complementary symmetry circuit are greater than the other half, such as when either the positive or negative half is delivering high current to the output load, one of the bias transistors, Q4 or Q5 is operated at or near its saturation voltage. When operated near saturation, the transistor cannot be assumed to have a negligible base current, and current from the $V_{IN}$ node is drawn off toward the output circuit through R6 or R7, resulting in loss of amplification and distortion to the amplified signal.

For example, if positive output current is delivered to the load through Q1, the $V_{BE}$ drops of Q6 and Q8 increase, as does the drop across $R_{E1}$. At the same time the $V_{CB}$ of Q5 is decreased, and Q5 approaches saturation. At some high output current value, some current is drawn from $V_{IN}$ through the collector-base junction of Q5, and through R7 to the output.

Even when Q4 and Q5 are not operated at or near saturation, the dynamic fluctuations of current through R6 and R7 are non-linear and can introduce distortion into the amplified signal.

It is an object of the present invention to devise an amplifier using a bias circuit incorporating a feedback connection to the output nodes of subsequent gain transistors for the purpose of controlling the bias of these transistors, but with an isolation mechanism to eliminate the distortion found in prior art.

SUMMARY OF THE INVENTION

The above object has been achieved in an audio amplifier having emitter follower, complementary symmetry output transistors utilizing feedback from the output stage. It has been found that use of optical coupling in a feedback loop for biasing the output transistors reduces distortion by isolating the bias circuit from the output nodes and preventing saturation in transistors forming the bias circuit. Sufficient feedback is provided to maintain Class A or Class AB operation, yet input current is not drawn off to the output node through the feedback circuit, thereby preventing distortion.

BRIEF DESCRIPTION OF THE DRAWINGS

FIG. 1 is a schematic diagram of a prior art simple complementary symmetry emitter follower output stage showing location of input signal, output signal, and bias circuit.

FIG. 2 is a schematic diagram of a simple bias circuit of the prior art.

FIG. 3 is a schematic diagram showing the bias circuit of FIG. 2 incorporated into the output circuit of FIG. 1.

FIG. 4 is a schematic diagram of a bias circuit of the type employed in U.S. Pat. No. 3,995,228.

FIG. 5 is a schematic diagram of a prior art amplifier utilizing the bias circuit of FIG. 4.

FIG. 6 is a schematic diagram of a prior art amplifier utilizing the bias circuit of FIG. 4.

FIG. 7 is a schematic diagram of an amplifier using a feedback circuit in accord with the present invention.

BEST MODE FOR CARRYING OUT THE INVENTION

With reference to FIG. 7, a complementary symmetry amplifier is shown with output transistors Q11 and Q12 connected in an emitter follower configuration. Transistors Q11 and Q12 are a complementary transistor pair, reasonably matched in performance characteristics. Resistors of equal value, R11 and R12 are connected to the emitters of each of these transistors, with a common node, N, connected to output terminal 15 where an output signal, $V_{out}$ is taken and directed to a load. The resistors R11 and R12 typically have low value, on the order of one ohm. Output transistors Q11 and Q12 have collectors connected to DC power supplies, providing the voltages V+ and V− at terminals 17 and 19 respectively.

Output transistors Q11 and Q12 each have a base which is driven by complementary, driver transistors Q13 and Q14, respectively. Each of these transistors has a collector connected to a respective voltage supply, V+ or V−. The emitters of the driver transistors are connected to a single shared conductive element, R21, which provides a bias path for the drivers. Conductive element R21 may be a resistor or a thermistor. Current through R21 is sampled by resistor R23 and then the current sample activates a photoemitting element 23. Photoemitting element 23 may be a photodiode or incandescent lamp.

Light from the photoemitting element 23 falls upon a photoconductive element, such as base of phototransistor Q21 which sources feedback current to driver transistors Q13 and Q14. The photoconductive element may be a photoresistive element. Input signal $V_{IN}$ is supplied to the amplifier at input terminal 31. The current sources I1 and I2 provide a constant source of current to bias the transistors Q13 and Q14. This constant current is opposed by feedback current generated by phototransistor Q21, yet the amount of base current is enough to keep Q13 and Q14 on. The negative feedback from phototransistor Q21 limits the base current, but not to the extent that Q13 and Q14 are turned off. Note that the feedback is not taken directly from the output node, N, but from the voltage potential difference between two symmetric locations between the input and output nodes. The amount of feedback can be adjusted by the proper selection R23.

Optically isolated bias feedback allows bias current tracking without introducing the non-linearities found in earlier designs. Moreover, high currents and high slew rates for output transistors are preserved while bias feedback circuits of the prior art which are coupled between input and output nodes deleteriously affect maximum output current and slew rate.

In FIG. 7, the output transistors Q11 and Q12 could be complementary bipolar transistors or complementary field effect transistors. In the case where they are field effect transistors, output terminals are source electrodes and input terminals are gate electrodes of these transistors. In the situation where the transistors are bipolar transistors, output terminals are emitter electrodes and input terminals are base electrodes.

I claim:

1. In a high fidelity audio amplifier of the push-pull type having first and second complementary symmetry output transistors, each transistor having a control electrode and an output electrode, the improvement comprising, a current sampling node connected to each output transistor and a current sampling means connected to said nodes for sampling a sum of the current in both of said output transistors, a feedback circuit having a current loop between output terminals of said complementary symmetry output transistors, said loop optically communicating with a conductive element and a photoemitting element in series therewith, said photoemitting element connected to said current sampling means to optically couple a signal representative of a current sample in the current sampling means to said feedback circuit, thereby controlling idle bias current common to said complementary symmetry output transistors.

2. A high fidelity, push-pull, complementary symmetry, audio amplifier output circuit comprising, first and second complementary symmetry output transistors, each transistor having a control electrode and an output electrode, means for sampling a sum of the current in both of said first and second output transistors, a feedback loop means, having portions communicating with a control electrode of each of said first and second output transistors, for controlling bias of said output transistors, said feedback loop means including a photoconductive element with an electrode communicating with a signal input means, and a photoemitting element in series with said current sampling means and optically communicating with said photoconductive element, whereby the sampled sum of the current in both of said first and second output transistors is optically communicated to said feedback loop means, thereby controlling bias current common to said complementary symmetry output transistors.

3. A high fidelity push-pull, complementary symmetry, audio amplifier output circuit comprising, first and second complementary symmetry output transistor pairs, each transistor pair arranged in a cascade configuration of two transistors having a current sampling point therebetween and an output electrode, means connected to said current sampling points for sampling a sum of the current in both of said first and second output transistor pairs, a feedback loop means, connected to each of said first and second output transistor pairs, for controlling bias of said output transistor pairs, said feedback loop means including a photoconductive element with an electrode communicating with a signal input means, and a photoemitting element in series with said current sampling means and optically communication with said photoconductive element, whereby the sampled sum of the current in both of said first and second output transistor pairs is optically communicated to said feedback loop means, thereby controlling bias current common to said complementary symmetry output transistor pairs.

4. The amplifier output circuit of claim 3 wherein each of said transistor pairs are connected in an emitter follower configuration.

* * * * *

UNITED STATES PATENT AND TRADEMARK OFFICE
CERTIFICATE OF CORRECTION

PATENT NO.   : 4,752,745
DATED        : June 21, 1988
INVENTOR(S)  : Nelson S. Pass It is certified that error appears in the above—identified patent and that said Letters Patent is hereby corrected as shown below:

Column 2, line 43, "$V_{BE}$of" should read -- $-V_{BE}$ of-- --.

Column 2, line 44, "V $_b$across" should read -- $-V_b$ across-- --.

Column 2, line 47, "$V_{RE1}$and" should read -- $-V_{RE1}$ and-- --.

Claim 3, column 6, line 22, "optically communication" should read -- -optically communicating-- --.

Signed and Sealed this

Eighteenth Day of April, 1989

Attest:

DONALD J. QUIGG

*Attesting Officer*  *Commissioner of Patents and Trademarks*